United States Patent [19]
Hodos et al.

[11] Patent Number: 5,154,730
[45] Date of Patent: Oct. 13, 1992

[54] SEMICONDUCTOR WAFER PROCESSING MODULE HAVING AN INCLINED ROTATING WAFER HANDLING TURRET AND A METHOD OF USING THE MODULE

[75] Inventors: Julian Hodos, Howard Beach, N.Y.; Steven Hurwitt, Park Ridge, N.J.

[73] Assignee: Materials Research Corporation, Orangeburg, N.Y.

[21] Appl. No.: 701,771

[22] Filed: May 17, 1991

[51] Int. Cl.⁵ .............................. C23C 13/08
[52] U.S. Cl. .................. 29/25.01; 414/223; 204/298.28; 118/730
[58] Field of Search ............ 29/25.01; 414/223; 204/298.28; 118/730

[56] References Cited

U.S. PATENT DOCUMENTS

| | | |
|---|---|---|
| 3,756,939 | 9/1973 | Hurwitt . |
| 4,241,698 | 12/1982 | Vitale . |
| 4,405,435 | 9/1983 | Tateishi et al. . |
| 4,498,833 | 2/1985 | Hertel . |
| 4,634,331 | 1/1987 | Hertel . |
| 4,655,676 | 4/1987 | Jannborg et al. . |
| 4,670,126 | 6/1987 | Messer et al. . |
| 4,674,621 | 6/1987 | Takahashi . |
| 4,675,096 | 5/1988 | Takahashi et al. . |
| 4,735,540 | 5/1988 | Allen et al. . |
| 4,747,928 | 5/1988 | Takahashi et al. . |
| 4,778,331 | 10/1988 | Kimata et al. . |
| 4,778,332 | 10/1988 | Byers et al. . |
| 4,795,299 | 1/1989 | Boys et al. . |
| 4,836,905 | 6/1989 | Davis et al. . |
| 4,851,101 | 7/1989 | Hutchinson . |
| 4,907,931 | 7/1989 | Mallory et al. . |
| 4,923,584 | 5/1990 | Bramhall, Jr. et al. . |
| 4,944,860 | 7/1990 | Bramhall, Jr. et al. . |
| 4,952,299 | 8/1990 | Chrisos et al. . |

FOREIGN PATENT DOCUMENTS

| | | |
|---|---|---|
| 240913 | 11/1986 | Fed. Rep. of Germany . |
| 1465247 | 3/1989 | U.S.S.R. . |

*Primary Examiner*—Olik Chaudhuri
*Assistant Examiner*—David E. Graybill
*Attorney, Agent, or Firm*—Wood, Herron & Evans

[57] ABSTRACT

A sputtering module incorporated into a wafer processing system includes an evacuatable housing connectable to one or more other evacuatable housings and a wafer handling turret adapted to receive a wafer in horizontal orientation at a load/unload position and rotate the wafer 180° about an inclined axis into vertical orientation at a sputtering position across from a sputtering target. After sputter coating, the wafer handling turret again rotates 180° about the inclined axis to rotatably return the wafer to the horizontal load/unload position, whereupon the wafer is lowered to a horizontal receiving position for subsequent retrieval by an arm extendible into the module from an adjacently situated housing. The wafer handling turret includes three wafer holding rings and a disc-shaped shutter that is rotatably located in front of the target during precleaning.

28 Claims, 5 Drawing Sheets

SEMICONDUCTOR WAFER PROCESSING MODULE HAVING AN INCLINED ROTATING WAFER HANDLING TURRET AND A METHOD OF USING THE MODULE

FIELD OF THE INVENTION

This invention relates to a wafer handler in a semiconductor wafer processing module which is connectable to other modules in a semiconductor wafer processing system. More particularly, this invention relates to a wafer handling turret particularly suitable for use in a sputter coating module.

BACKGROUND OF THE INVENTION

In state of the art semiconductor wafer processing systems, the wafers are processed one at a time according to a predetermined sequence of steps. For maximum efficiency in performing a particular sequence of process steps, it is preferable to perform each step in a separate, evacuatable chamber, with the multiple chambers arranged in a circular array and interconnected to one or more central transfer chambers or arranged in-line and interconnected via an in-line conveyor. This approach requires precision transfer of single wafers to and from, or along, the desired sequence of processing chambers.

To facilitate precise alignment of the wafers during transfer and to minimize the possibility of wafer breakage, it is highly desirable to move the wafers in horizontal disposition. Nevertheless, it is also preferable to process the wafers while disposed vertically. Vertical processing significantly reduces the possibility of undesired particulate contamination of the wafers, a condition to which semiconductor wafers are highly susceptible. Therefore, in processing of wafers one at a time, it is desirable to move a wafer from horizontal to vertical for performance of a processing step, and then back to horizontal, for subsequent conveyance to the next processing chamber.

Another concern in processing of semiconductor wafers relates to production efficiency. Particularly when wafers are processed one at a time, it is important to maintain maximum wafer throughput during operation of the system. This means that the time duration of the wafers in each of the chambers should be kept as short as possible, thereby to minimize overall processing time. The fewer the number of mechanical devices required to handle a wafer in any given module, the less overall time will be required to process a wafer through that particular module.

It is also important for the system to be capable of operating substantially continuously, or at least with minimum downtime for maintenance of the modules or for any intermediate steps that may occasionally be required when processing a batch of wafers. One such intermediate step is required for sputter coating, where it is necessary to preclean the sputtering target prior to coating of a new batch of wafers from a cassette. Typically, this precleaning step is accomplished by sputtering the target for a short duration. To minimize coating of surfaces within the module during precleaning, many sputtering modules include a shutter which is moved in front of the target prior to precleaning and away from the target after precleaning. This required movement of the shutter represents two mechanical steps to be performed, and as a result, wafer processing time within the sputtering module is increased and through-put for the entire system is reduced. If the shutter were to be eliminated entirely, the sputtering module would have to be cleaned more frequently, which would also result in extra downtime. In short, present methods of precleaning a sputter target decrease the overall efficiency of wafer processing.

It is an object of this invention to simply and efficiently move semiconductor wafers one at a time from a horizontal conveying disposition to a vertical processing disposition within a wafer processing module.

It is another object of this invention to reduce the number of operational steps typically associated with sputter coating a batch of semiconductor wafers.

It is still another object of the invention to increase the efficiency of operation of a sputter coating module incorporated into a wafer processing system.

SUMMARY OF THE INVENTION

This invention contemplates a wafer processing module equipped with an inclined, rotatable wafer handling turret which receives a semiconductor wafer in horizontal disposition at a load/unload position and rotates the wafer approximately 180° about an inclined axis to locate the wafer in substantially vertical orientation at a vertical processing position across from a wafer processing apparatus. After processing, the wafer handling turret again rotates the wafer about the inclined axis back to the load/unload position. Thereafter, the wafer is retrieved by a wafer arm extendible through an access port in the module, and another wafer is moved into the module for processing in a similar manner.

Movement of a wafer from horizontal to vertical, and then back to horizontal, by rotation of a wafer handling turret about a single, inclined axis simplifies and reduces the wafer handling equipment required to be housed within the wafer processing module.

Particularly when the processing module of this invention is a sputtering module, this inventive wafer handling turret also reduces the maintenance time and the number of operational steps required to coat a batch of wafers. To accomplish this, the turret preferably includes three wafer holders and a precleaning shutter. The wafer holders and shutter are mounted to the turret in similar fashion, and they are spaced angularly 90° thereabout. During precleaning, the shutter is simply rotated to the vertical processing position in front of the target, in the same manner that the wafer holders are rotated in front of the target. This structure eliminates the prior need for a separate shutter moving mechanism within the module because the same mechanism which rotates the wafers for processing also moves the shutter into position for precleaning.

If desired, four wafer holders may be spaced at 90° angles on the inclined wafer handling turret, and one wafer may be picked up at the load/unload position while another wafer is located at the processing position. Thereafter, the two wafers are rotated simultaneously between the load/unload position and the processing position.

According to a preferred embodiment of the invention, a wafer processing module includes an evacuatable housing with a port in one side and a cathode/target assembly removably connectable to the opposite side. A valve controls access into the housing through the port. Horizontal supports are located adjacent the port for holding a wafer received through the port. A vertically raisable platform moves the wafer from the horizontal supports to a load/unload position thereabove. A wafer handling turret mounted within the housing on an axis inclined at an angle of about 45° with respect to vertical is adapted to receive the wafer at the load/unload position, rotate the wafer to a vertical processing position across from the cathode/target assembly, and then rotatably return the wafer to the load/unload position.

The wafer is moved through the port during introduction and retrieval by a robot arm housed within an adjacently situated transfer chamber. The vertically raisable platform moves the wafer upwardly to the load/unload position where it is held within a wafer holder, preferably a ring, by top surface engaging spring stops and bottom surface engaging latches. The platform then retracts downwardly. Rotation of the wafer holding ring and the turret about the inclined axis moves the held wafer from horizontal to vertical disposition at the vertical processing station. A heating cylinder moves horizontally to a location adjacent the rear surface of the vertically held wafer for heating the backside of the wafer during sputtering. When sputtering is complete, the heating cylinder retracks and the turret again rotates 180° about the inclined axis to move the sputter coated wafer back to the load/unload position, whereupon the vertically movable platform raises up to retrieve the wafer and return it to the horizontal supports. The valve then opens the port so that the sputter coated wafer can be retrieved from the supports by the robot arm. Subsequently, additional wafers are processed in a similar fashion.

The turret is preferably rotatably driven by a stepping motor located outside of the housing and connected via a ferrofluidic feedthrough. This reduces the number of mechanically movable parts within the module, thereby minimizing particulate formation due to friction.

One other important technical advantage of the invention arises from the fact that a vacuum chamber containing the components of the apparatus consists of two interconnected compartments, a horizontially extended load/unload compartment and a vertically extended process compartment. This configuration maximizes the distance between the load/unload position and the source of generating process heat. This allows a user, if desired, to locate a device with a highly effective water pumping speed, i.e., a cold trap, within the chamber between the load/unload position and the access port to assist in water vapor removal.

These and other features of the invention will be more readily understood in view of the following detailed description and the drawings.

DETAILED DESCRIPTION OF THE DRAWINGS

Figure 1:
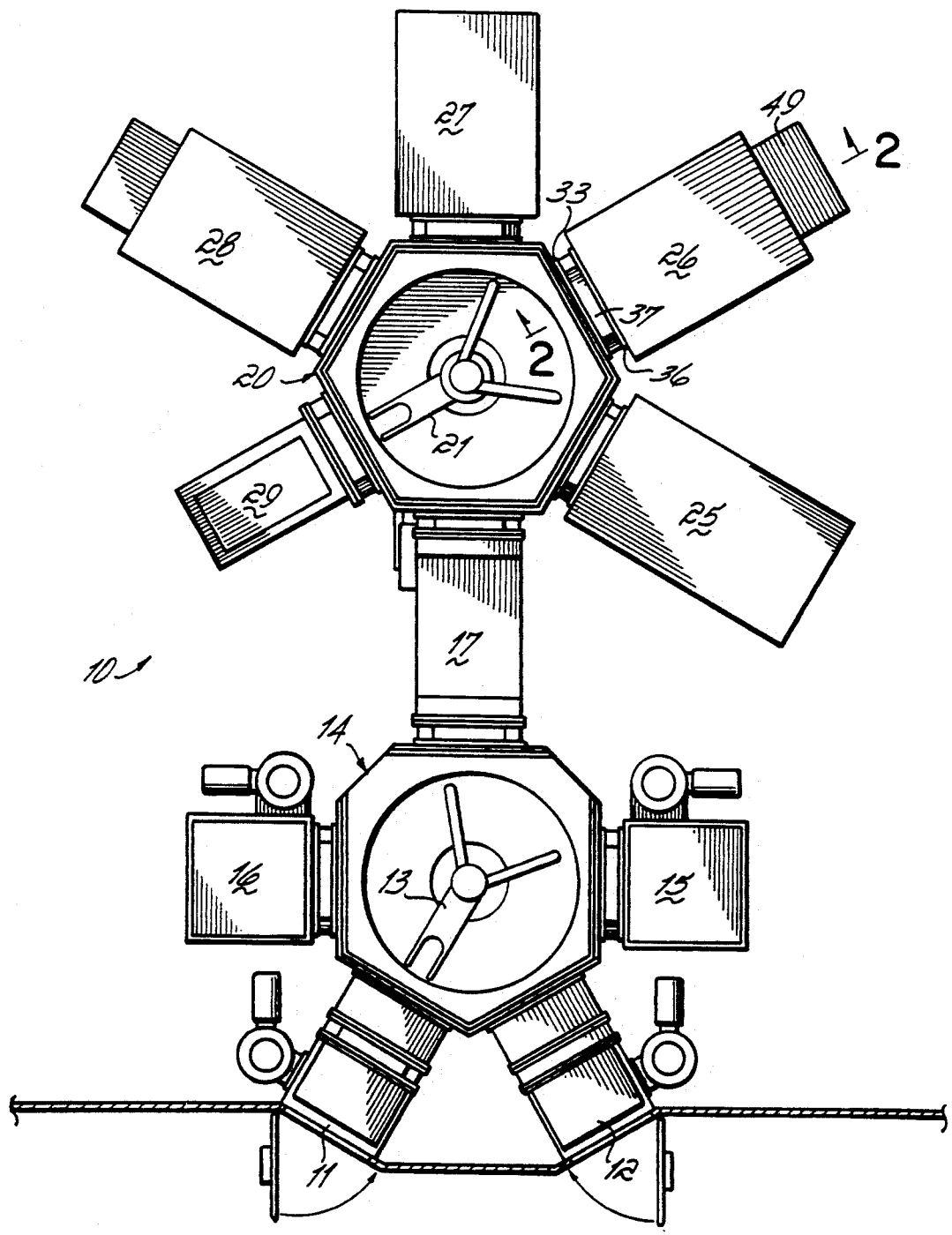
FIG. 1 is a schematic plan view depicting a wafer processing system which incorporates a sputtering module equipped with an inclined, rotatable wafer handling turret in accordance with a preferred embodiment of the invention.

FIG. 1 shows a wafer processing system 10 which incorporates a wafer processing module according to a preferred embodiment of the invention. The system 10 includes load lock chambers 11 and 12 for entry and exit of wafers to and from the system 10. The wafers are stored in the load lock chambers 11 and 12 on vertically movable cassettes, and the wafers are retrieved from, and eventually returned to, the load lock chambers 11 or 12 by a rotatable wafer robot arm 13 mounted within the center of a transfer chamber 14. Degas chambers 15 and 16, and an aligner chamber 17 also connect to the first transfer chamber 14 around the periphery thereof. Preferably, each of the surrounding chambers 11, 12, 15, 16 and 17 are isolatable from first transfer chamber 14 by appropriate valves, and are independently evacuatable. An opposite end of the aligner chamber 17 connects to a second transfer chamber 20 which houses a second rotatable wafer robot arm 21. An etching chamber 25, one sputtering chamber 26, a rapid thermal processing chamber 27, another sputtering chamber 28 and an optional processing chamber 29 surround and connect to the second transfer chamber 20. Again, similar to the chambers surrounding first transfer chamber 13, each of the chambers 25, 26, 27, 28 and 29 is isolatable from the second transfer chamber 20 by at least one valve and is independently evacuatable.

The invention relates to an inclined, rotatable wafer handling turret 32 housed within sputtering chamber 26. The wafer handling turret 32 is more clearly shown in FIG. 2. While FIG. 1 shows one particular configuration of interconnected wafer processing chambers, it is to be understood that the wafer processing system 10 incorporating the wafer handling turret 32 and module 26 of this invention may be rearranged to better accommodate other wafer processing sequences. It is also to be understood that, while the rotatable wafer handling turret 32 is shown in conjunction with processing chamber 26, which is dedicated to sputtering, this wafer handling turret 32 may also be advantageously used in any wafer processing module or station which requires movement of a wafer 34 from a horizontal transfer disposition to a vertical processing disposition.

Figure 2:
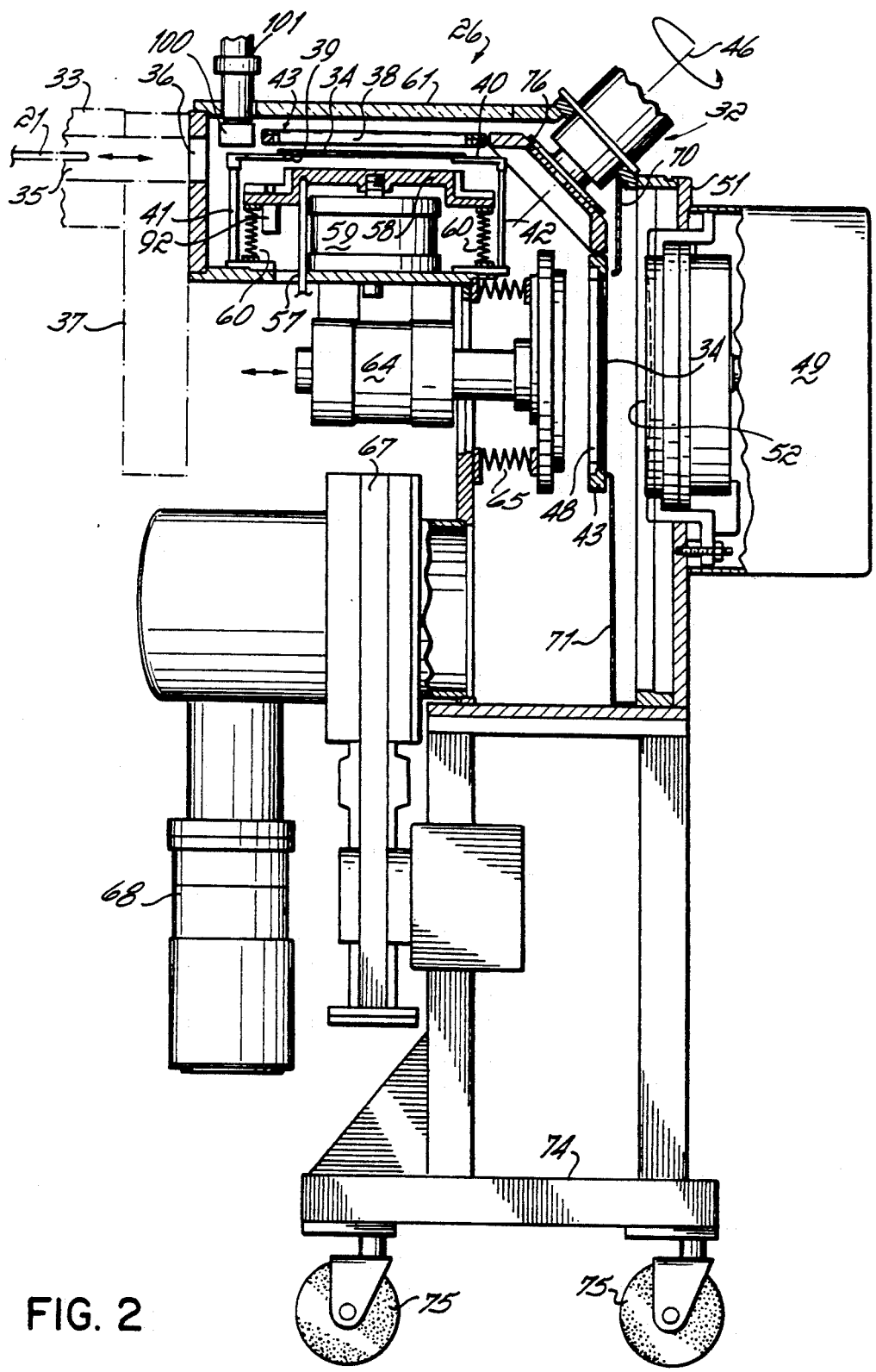
FIG. 2 is a cross-sectional view taken along lines 2—2 of FIG. 1.

FIG. 2 shows, in cross-sectional view, an inclined, rotatable wafer handling turret 32 housed within sputter chamber 26 in accordance with the preferred embodiment of the invention. An exterior wall 33 of the second transfer chamber 20 has a port 35 formed therein. The sputtering chamber 26 also has a slit port 36 that communicates with port 35. Operation of a valve 37 provides horizontal access into the first sputtering chamber 26 through ports 35 and 36 for the wafer robot arm 21 mounted in the second transfer chamber 20. The transfer chamber 20 may also have a valve (not shown) for opening and closing port 35. The wafer robot arm 21 holds a wafer 34 and extends horizontally into chamber 26 to place the wafer 34 at a receiving position upon horizontal wafer supports 39 and 40 which are mounted to upper ends of uprights 41 and 42, respectively. The robot arm 21 holds the wafer 34 by gravity on a two-tine fork-like platform which brings the wafer 34 into chamber 26 at a vertical level slightly higher than the top of supports 39 and 40. The forks of the arm 21 move horizontally around opposite sides of upright 41 and support 39. The robot arm 21 then moves vertically downward to transfer the wafer 34 from the forks to the supports 39 and 40. The robot arm 21 then retracts through ports 35 and 36, and valve 37 closes.

From the supports 39 and 40, the wafer 34 is moved vertically upward to a loading position 38 where it is held and retained by a wafer holder 43 which forms part of the wafer handling turret 32. The manner of vertical raising and holding of the wafer 34 by the wafer holder 43 will be discussed in more detail later in this detailed description. The inclined, rotatable wafer handling turret 32 is mounted to chamber 26 along an inclined axis 46 that is inclined at an angle of about 45° from vertical. Rotation of the wafer handling turret 32 approximately 180° about axis 46 moves the wafer 34 from horizontal disposition at loading position 38 to a vertical disposition at a processing position 48. A cathode assembly designated generally by numeral 49 removably connects to an outer or rear wall 51 of the first sputtering module 26. The cathode assembly 49 includes a sputtering target 52 mounted vertically and spaced from the wafer processing position 48. After sputter coating, the wafer handling turret 32 rotates another 180° to move the wafer holder 43 and wafer 34 back to the loading position 38.

Figure 3:
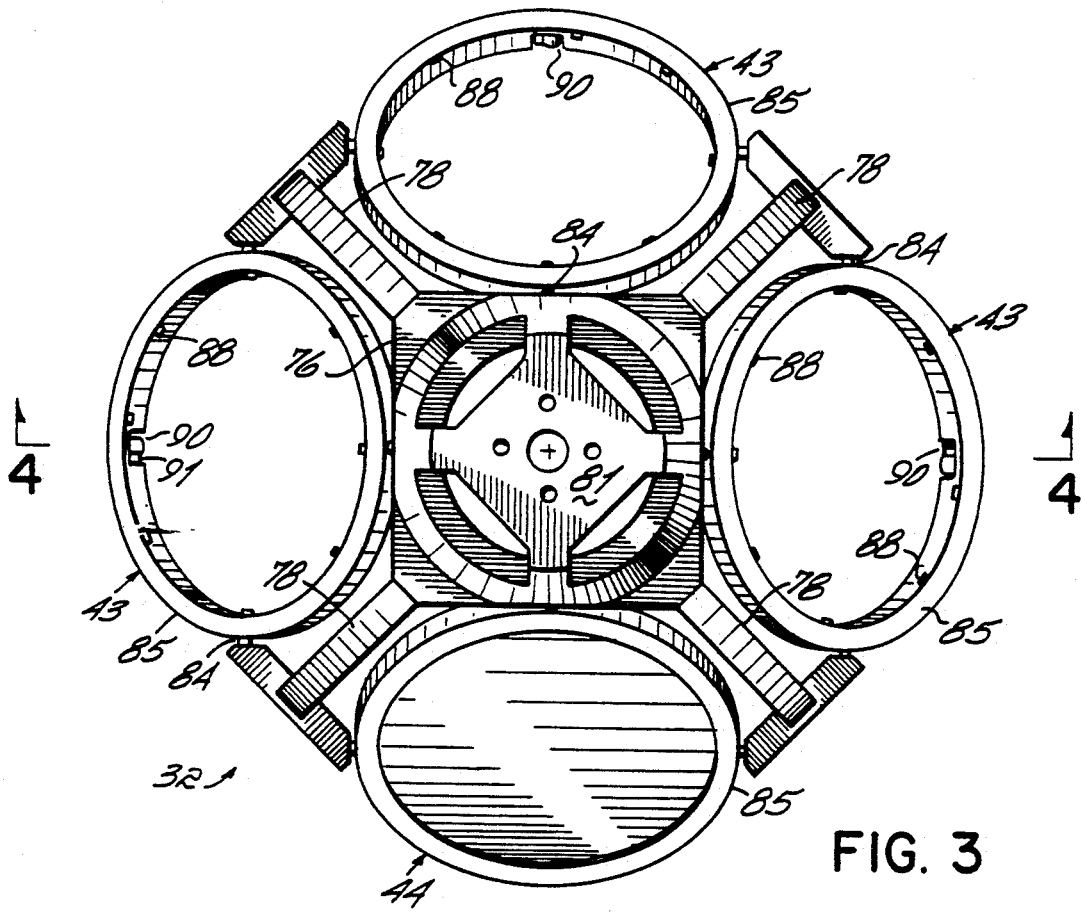
FIG. 3 is an enlarged plan view of a wafer handling turret in accordance with a preferred embodiment of this invention.
Figure 4:
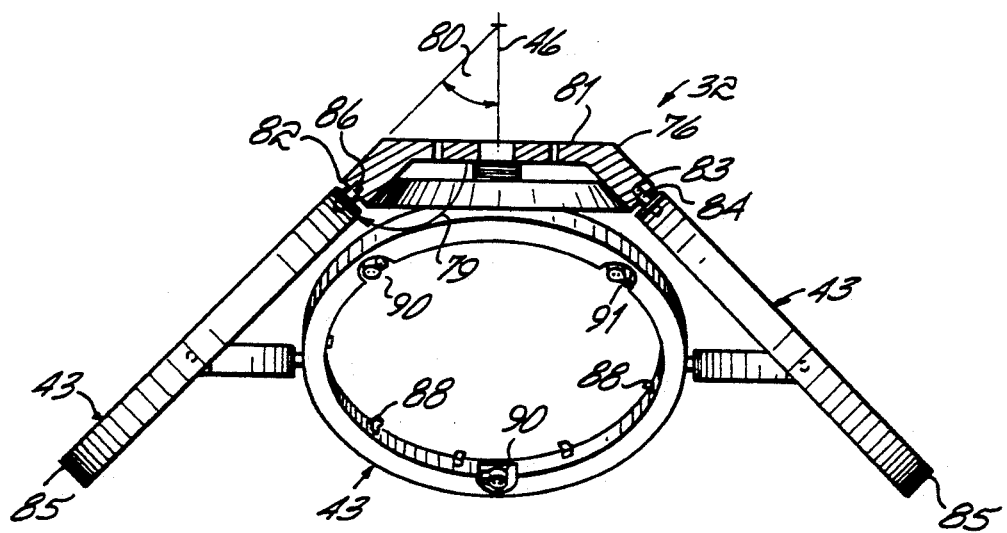
FIG. 4 is a cross-sectional view taken along lines 4—4 of FIG. 3.

The inclined, rotatable wafer handling turret 32 includes at least two wafer holders 43 spaced angularly 180° apart. With two wafer holders 43 spaced 180° apart, and controlled rotation of the turret 32 in 180° increments, one of the holders 43 is always located at the load/unload position 38 and the other wafer holder 43 is located at the wafer processing position 48. Preferably, the wafer handling turret 32 includes three wafer holders 43 and a disc-shaped shutter 44 spaced 90° apart (FIG. 3).

Use of three wafer holders 43 and a shutter 44 reduces downtime for the module 26, and as a result, for the whole system 10. Sputter coating invariably causes some undesired deposition of sputtered material onto any accessible surfaces within the chamber 26. Typically, the most accessible surfaces are those which hold the wafer 34 during sputtering. After a period of time, the total accumulation of sputtered material onto these surfaces becomes intolerable and requires disconnection of the sputtering module 26 for cleaning. Disconnection and cleaning represents downtime that could otherwise be used for wafer processing. The use of three wafer holders 43 lengthens the time span between cleanings because, basically, undesired sputter coating is spread over three different holders 43. In short, with three wafer holders 43, for a given length of time, and with equal use of all three wafer holders 43, the total accumulation of undesired sputtered material on each of the wafer holders 43 is less than it would otherwise be if only one or two wafer holders 43 were used. Perhaps more importantly, throughput time for a batch of wafers 34 is decreased because the wafer handling turret 32 also includes the shutter 44 which may be easily rotated in front of target 52 for precleaning. No separate precleaning operation is required other than simple mechanical rotation of the turret 32, the same device which moves the wafers 34 into position for sputtering.

While the system 10 may be operated to utilize two wafer holders 43 simultaneously, this mode of operation is not preferred. For most wafer processing applications, one wafer holder 43 is used and the turret 32 is rotated in 180° increments to move a held wafer from horizontal to vertical, and then vice versa. When it is time to use a different wafer holder 43, the turret 32 is simply indexed 90° with no wafer 34 in chamber 26 to place the next wafer holder 43 to be used in a horizontal orientation at the loading position 38.

A vertically raisable elevator platform 58 rides on air cylinder 59. The elevator 58 and air cylinder 59 reside beneath wafer loading position 38 and between uprights 41 and 42. The platform 58 provides cooling by surface contact with the bottom of the wafer 34 after sputtering and prior to retrieval of the wafer 34 from sputtering module 26 by robot arm 21. Platform 58 is cooled by tube 57 which carries cooling fluid. If desired, the wafer 34 may also be cooled prior to sputtering. Air cylinder 59 is surrounded by a cylindrical bellows 60 to provide pressure differential necessary for vertical raising and lowering of the cylinder 59. Support plate 56 and platform 58 seal the inside of chamber 26 from the cylinder 59. Otherwise, due to the vacuum environment required for wafer processing, pressurized vertical movement of cylinder 59 would not be possible. If desired, this plate 56 and platform 59 may be a one piece construction.

Air cylinder 59 also vertically raises the wafer 34 off of the horizontal supports 39 and 40 and into the loading position 38 where it is grasped and retained by one of the wafer holders 43. After sputtering, the cylinder 59 also retrieves the wafer 34 from the wafer holder 43 and moves it downwardly to the supports 39 and 40, whereupon robot arm 21 removes the wafer from the first sputtering chamber 26. The cylinder 59 is vertically movable a sufficient distance to prevent any contact with the wafer handling turret 32 during rotation.

A glass panel 61 is located above loading position 38 to enable an operator to look downwardly into the first sputtering module 26. Sputter module 26 also includes another cylinder 64 that is horizontally movable to a location adjacent to the rear surface of a wafer 34 held by the wafer holder 43 at the processing position 48. This cylinder 64 carries a heater to heat the wafer 34 during sputter processing. After sputtering, the cylinder 64 retracts horizontally in the direction of second transfer chamber 20. The heating cylinder 64 is also surrounded by a bellows 65. Horizontal movement of heating cylinder 64 must be sufficient to prevent any contact between the heating cylinder 64 and the wafer handler 32 during rotation. Preferably, the heating cylinder is of reduced diameter as as to fit within the wafer handler 43, almost in contact with the backside of wafer 34 when held across from the target 52.

The module 26 also includes a gate valve 67 and a vacuum pump 68 for evacuating the module 26. Upper and lower shields 70 and 71 extend downwardly and upwardly, respectively, from the rear wall 51 to minimize undesired sputter coating of surfaces other than the wafer 34. As shown in FIG. 2, sputter module 26 also preferably includes a support frame 74 mounted on wheels 75 for increased mobility in configuring a desired wafer processing system 10.

Figure 7:
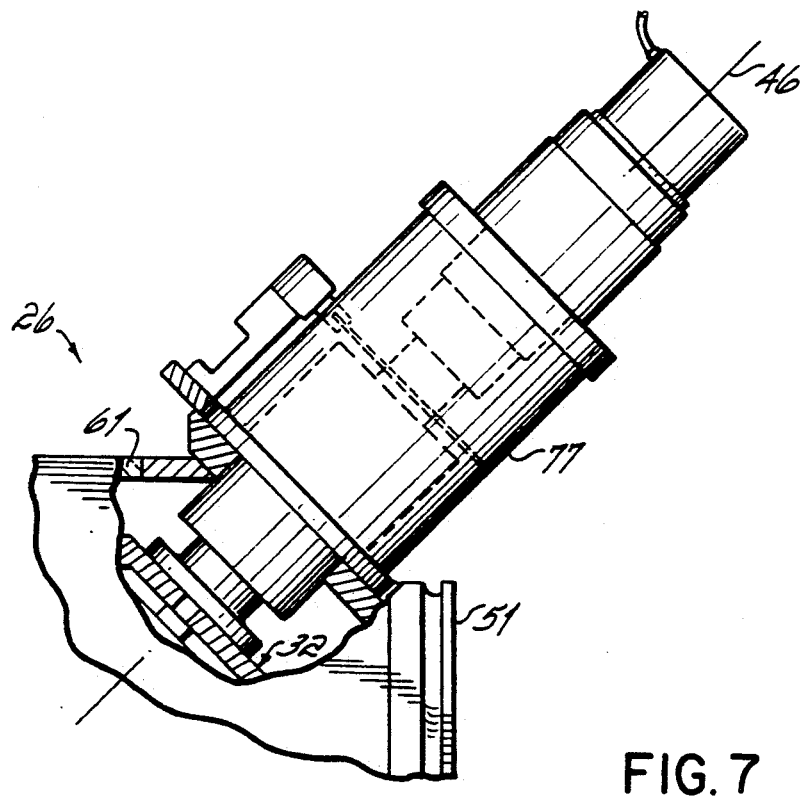
FIG. 7 is an enlarged cross-sectional view, similar to FIG. 5, of the cylindrical turret housing and motor.

As shown in FIG. 3, the wafer handling turret 32 includes a base plate 76 connected orthogonally to the bottom end of a turret housing 77 (FIG. 7). Four arms 78 extend from equally spaced positions on the base plate 76. Each arm 78 extends at an angle 80 of about 45° from axis 46. Each arm 78 has a cross piece 81 connected perpendicularly at an end thereof. Each cross piece 81 has two angled end surfaces 82 with threaded bores 83 therein. The plate 76 also has four similar threaded bores 82. each located midway between a pair of the arms 78. Each of the bores 83 is sized to receive a screw 86 for holding a ceramic pin 84 which extends radially inwardly from the respective arms 78 and plate 76 to capture a ring 85 which forms part of the wafer handler 43. Preferably, the pins 84 and screws 86 remain in plate 76. When mounting a wafer holder 43, the other two pins 84 are mounted by extending the screws 86 through holes aligned with the bores 83 on opposite sides of wafer holder 43. As shown in FIG. 3, the turret 37 preferably has three wafer holders 43 and a shutter 44, each held between a pair of arms 78 by ceramic pins 84. The ceramic pins 84 allow radial expansion of the wafer holder 43 at the high temperatures typically associated with wafer processing, i.e., up to 500° C. Even with radial expansion during sputtering, the wafer holders 43 remain centered between the respective arms 78. Moreover, the ceramic pins 84 electrically and thermally isolate the wafer holder 43 and wafer 34 from the rest of the turret 32.

Figure 5:
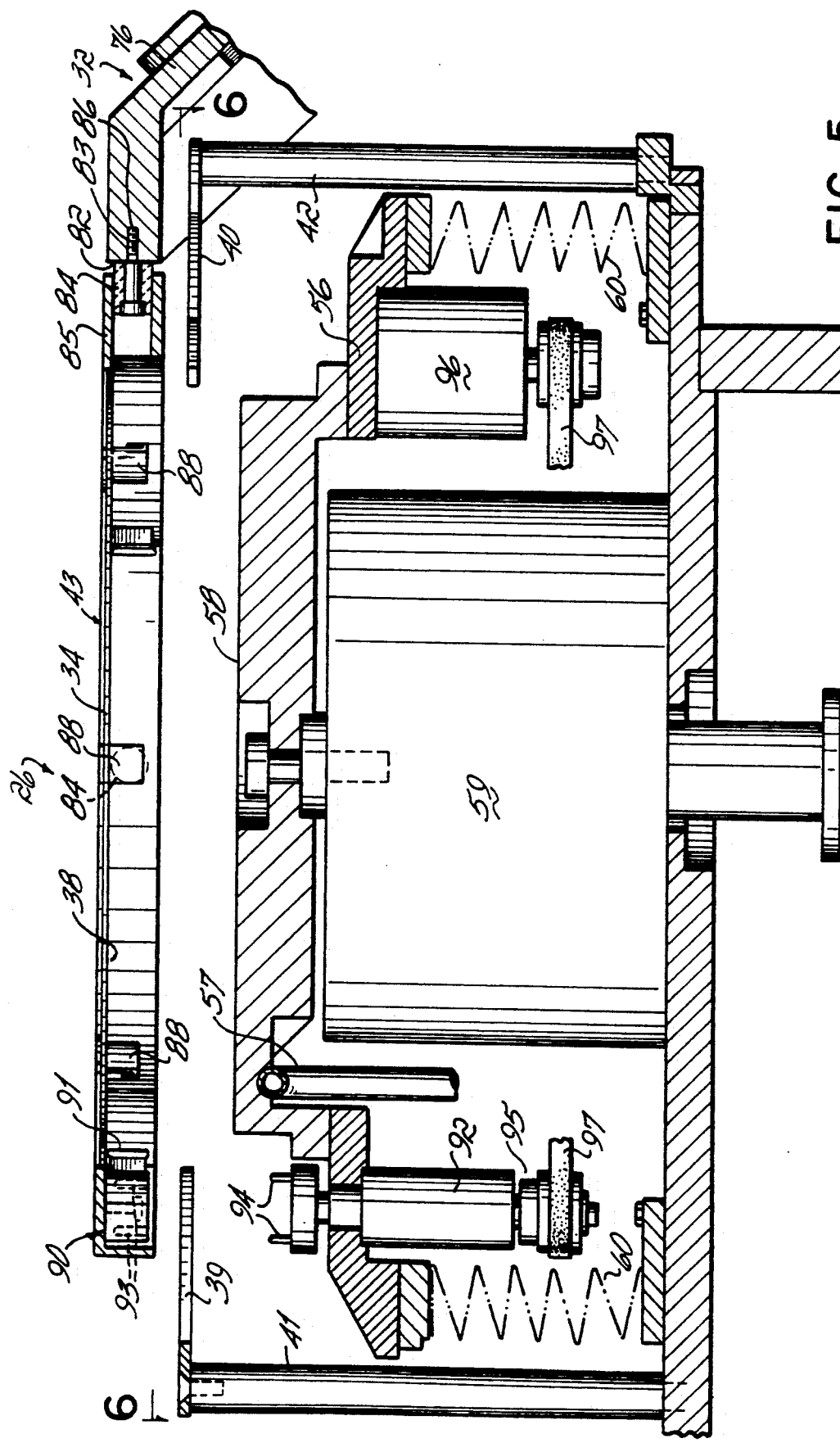
FIG. 5 is an enlarged cross-sectional view of the sputtering chamber of FIG. 2.

Each wafer holder 43 has radially inwardly directed spring stops 88 spaced equidistantly about its inner diameter, as shown in both FIGS. 3 and 5. When a wafer holder 43 is at the loading position 38, the spring stops 88 are on the top surface. The rings 85 are sized so that the inner diameter is slightly oversized with respect to the diameter of the wafer 34 to be processed. The spring stops 88 extend radially inwardly a sufficient distance to prevent the wafer 34 from moving above the top surface of the ring 85. Each ring 85 also has at least three latching mechanisms 90 angularly spaced on 120° intervals around its bottom surface. Each latching mechanism 90 includes a latch 91 oriented substantially tangential with the inner circumference of the respective ring 85, but which may be rotated into a radial position after a wafer 34 has been raised up within the ring 85.

Radial rotation of the latch 91 captures the wafer 34 between the spring stops 88 above and the latches 91 below (FIG. 5). Rotation of each latch 91 from a tangential position to a radial position is accomplished by rotation of a pair of spaced actuating rods 94 which are mounted on, and vertically movable with the cooling cylinder 59. Each pair of rods 94 is spaced and sized to be received within a correspondingly spaced and sized slot 93 in the bottom of the latch 91. Each pair of actuating rods 94 is connected to a ferrofluidic feedthrough 92 rotatably driven by a pulley 95 connected by a timing belt 97 to a pneumatic actuator 96 which is actuated by a controller (not shown). One input into the controller is a sensor (not shown) which senses a vertical position of cylinder 59 corresponding to contact of the wafer 34 with the spring stop 88. Other inputs to the controller may include programmable signals from a timing device. The cooperative interaction of the latches 91 and rods 94 is substantially similar to the wafer holding device described in applicant's commonly assigned U.S. Pat. No. 4,909,695, which is expressly incorporated by reference herein in its entirety. More particularly, FIGS. 20, 21 and 24 of U.S. Pat. No. 4,909,695 show a substantially similar structure for holding a wafer within a ring. Thereafter, lowering of cylinder 59 lowers the wafer 34 into surface contact with the radially directed latches 91 below, with downward force continuously applied to the top of the wafer 34 from the spring stops 88 above. Lowering of cylinder 59 also lowers the actuating rods 94.

If wafers of different diameters are to be processed, the inner diameter of the wafer holders 43 must be reduced accordingly so that the radially inwardly extending spring stops 88 and latches 91 will retain the peripheral top and bottom surfaces, respectively, of the different sized wafers 34 held therebetween. The actuator rods 94 must also be moved radially inward or outward to accommodate the different location of the latches 91.

Figure 6:
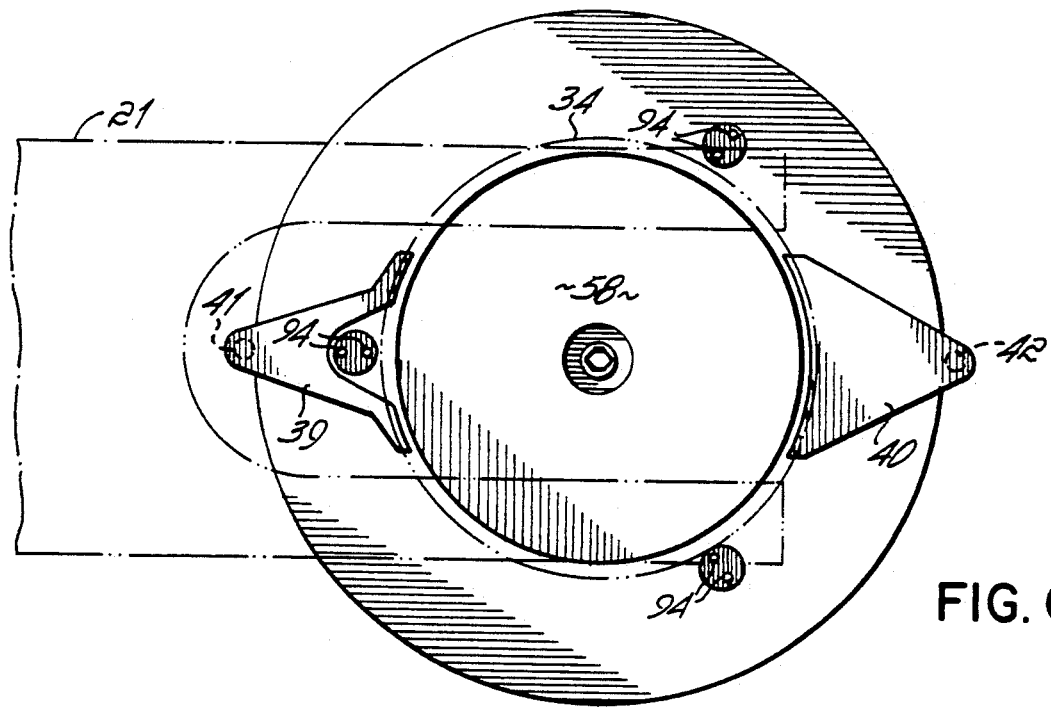
FIG. 6 is a sectional view taken along lines 6—6 of FIG. 5.

In operation, with valve 37 open, the robot arm 21 extends horizontally from second transfer chamber 20 through ports 35 and 36 to place a wafer 34 onto horizontal supports 39 and 40. The robot arm 21 supports the wafer 34 on forks which move around upright 41 during horizontal movement. FIG. 6 shows a top view of the supports 39 and 40, and the robot arm 21 is also shown in phantom. The arm 21 then lowers sufficiently to transfer the wafer 34 from the forks to the horizontal supports 39 and 40. Thereafter, the robot arm 21 retracts through ports 35 and 36, and valve 37 is closed.

The cylinder 59 then raises up from a retracted position into contact with the bottom of the wafer 34. Continued raising moves the wafer 34 within the ring 85 of the respective wafer holder 43 and into contact with the spring stops 88. The cylinder 59 is raised sufficiently to move the wafer 34 slightly beyond the vertical, at rest position of the springs 88. This vertical level of cylinder 59 places the rods 94 within the latches 91. When sensors (not shown) detect this predetermined vertical position of the cylinder 59, the actuating rods 94 rotate to move the respective latches 91 from tangential disposition to radial disposition beneath the lower surface of the wafer 34. With the latches 91 oriented radially, the cylinder 59 retracts downwardly to its original position, leaving the wafer 34 held between the stops 88 and the latches 91. If desired, cooling may occur during the loading operation. The turret 32 then rotates 180° to locate the held wafer 34 in the vertical processing position 48 in front of the processing assembly 49 for sputter coating. Once in this vertical position, the heating cylinder 64 extends horizontally toward the backside surface of the wafer 34 for heating during sputtering. When processing has been completed, the turret 32 is again rotated 180° to move the wafer 34 back to the loading position 38.

The cylinder 59 then raises up again to contact and cool the wafer 34 as it is retrieved from the wafer holder 43 in the same manner described previously, but in reverse. During retrieval, the rods 94 rotate the latches 91 back to tangential. The controller preferably moves the rods 94 according to a predetermined timing sequence, depending upon how much cooling of the wafer 34 is desired. The cooling cylinder 59 then lowers the wafer 34 downwardly until it rests upon supports 39 and 40. Valve 37 then opens, and the robot arm 21 extends horizontally through ports 35 and 36 at a level below the supports 39 and 40, raises upwardly a slight distance to lift the wafer 34 therefrom and retracts horizontally back into the second transfer chamber 20. Thereafter, each additional wafer 34 to be processed is moved into chamber 26, loaded, rotated, processed, rotated again, unloaded and then retrieved in a similar fashion.

The configuration of the module 26 with both a vertical component and a horizontal component provides another advantage. By mounting a downwardly opening C-shaped adaptor 100 between the load/unload position 38 and port 36, and placing additional "cold trap" components 101 in communcation with the module 26 thereat, more efficient pumping of water vapor from the module 26 may be achieved. The cold trap 101 acts as another cyrogenic pump connected to the module 26 and it is particularly effective because it is spaced away from heat sources in the module 26 such as the target 52 and heater 64, which would otherwise interfere with removal of water vapor.

While a preferred embodiment of the invention has been described, it is to be understood that the invention is not limited thereby and that in light of the present disclosure, various other alternative embodiments will be apparent to a person skilled in the art. For instance, the vertical processing position 48 could be above the load/unload position 38, rather than below, with the inclined axis of the turret 32 oriented perpendicularly to axis 46 as it is presently shown in the Figures. The number of wafer holders 43 could also be increased or decreased, and the shutter 44 could be sized either larger or smaller than the wafer holders 43. It may also become desirable to move and process wafers 34 in disposition other than from horizontal to vertical, respectively. Accordingly, the inclination of the axis 46 could be varied as desired.

Accordingly, it is to be understood that changes may be made without departing from the scope of the invention as particularly set forth and claimed.

I claim:

1. A semiconductor wafer processing module usable with a semiconductor wafer processing system, the module comprising:
   an evacuatable housing having a port formed therein;
   means for evacuating said housing;
   a wafer handling turret mounted within the housing and adapted to be rotated about an inclined axis angled at about 45° from vertical;
   at least one wafer holder connected to the turret, the wafer holder adapted to receive and hold a wafer in substantially horizontal disposition at a load/unload position adjacent the port when the turret is in a first position and to hold the wafer in substantially vertical disposition at a processing position when the turret has been rotated approximately 180° about the inclined axis to a second position,
   means for rotating said turret between said first and second positions, and
   means located across from the processing position for processing a wafer held thereat.

2. The wafer processing module of claim 1 wherein the at least one wafer holder is oriented at an angle of about 45° from the inclined axis.

3. The wafer processing module of claim 1 further comprising:
   at least two wafer holders connected to said turret and spaced angularly about said inclined axis 180° apart from each other.

4. The wafer processing module of claim 1 wherein there are three wafer holders and a shutter angularly spaced 90° apart from each other about said inclined axis, the shutter adapted to be selectively positioned in front of the wafer processing means during a precleaning operation after said turret has been rotated by said turret rotating means.

5. The wafer processing module of claim 1 wherein the wafer handling turret further comprises:
   a base plate oriented orthogonally to said inclined axis;
   four mounting members, each mounting member extending from the base plate at equally spaced locations thereof;
   three wafer holders and a shutter, each of the wafer holders and shutter mounted between a different pair of adjacent mounting members and angled at 45° from the inclined axis and equally spaced about said inclined axis at 90° intervals.

6. The wafer processing module of claim 5 wherein each wafer holder is connected to the base plate and between a respective pair of adjacent mounting members by ceramic pins, thereby to permit unobstructed radial expansion of the rings at high temperature.

7. The wafer processing module of claim 1 wherein the means for rotating the turret is located at least partially outside of the housing.

8. A wafer processing module comprising:
   a housing having a port formed in a wall thereof for entry and exit of a wafer to be processed;
   valve means for opening and closing the port;
   means for evacuating the housing;
   support means located adjacent the port for supporting a wafer in horizontal disposition;
   elevator means for vertically raising a wafer from the horizontal support means to a load/unload position located thereabove;
   a wafer handling turret located in said housing and supported for rotational motion about an axis inclined to the vertical and horizontal, said turret including at least one wafer holder adapted to receive and hold the wafer in a horizontal disposition at the load/unload position and rotatably move the held wafer about said inclined axis into a vertical disposition at a processing position;
   wafer processing means located opposite from the processing position for processing a wafer held thereat; and
   means for rotating the turret about said inclined axis to move said wafer holder between said load/unload position and said processing position.

9. The wafer processing module of claim 8 wherein the wafer processing means includes a cathode target assembly and the wafer processing step is sputter coating.

10. The wafer processing module of claim 8 wherein the processing position is located below the load/unload position.

11. The wafer processing module of claim 8 wherein the wafer processing means is removably connectable to the housing.

12. The wafer processing module of claim 8 wherein the wafer handling turret includes two wafer holders spaced 180° apart about said inclined axis.

13. The wafer processing module of claim 8 wherein the wafer handling turret includes three wafer holders and a shutter spaced 90° apart about said inclined axis.

14. The wafer processing module of claim 8 wherein the elevator means for vertically raising a wafer further comprises:
   a first heat transfer means for transferring heat between the heat transfer means and the wafer while the wafer is associated with said elevator means.

15. The wafer processing module of claim 8 wherein the elevator means for vertically raising a wafer further comprises:
   means cooperatively interacting with the wafer holder for retaining a wafer associated therewith prior to wafer processing and retrieving the wafer therefrom after wafer processing.

16. The wafer processing module of claim 8 further comprising:

a second heat transfer means for transferring heat between said heat transfer means and a wafer located at said processing position, said wafer heat transfer means horizontally movable to a position adjacent to the processing position for cooling and/or heating the backside of a wafer located at said processing position.

17. The wafer processing module of claim 8 further comprising:
wheels connected to the bottom of the housing to facilitate convenient transport and interconnection of the module to a wafer processing system containing other processing modules.

18. A wafer processing system comprising:
means for placing a wafer in substantially horizontal disposition at a load/unload position within a processing chamber;
means for processing a substantially vertically disposed wafer in the processing chamber; and
means for rotatably moving a wafer about a single inclined axis from a substantially horizontal disposition at said load/unload position to a substantially vertical disposition adjacent the means for processing the wafer, the means for rotatably moving said wafer further adapted to move the processed wafer back to a substantially horizontal disposition at said load/unload position by rotation about said inclined axis.

19. A sputtering module comprising:
a housing;
means for supporting a wafer in substantially vertical disposition in the housing;
a sputter target located within the housing, the target oriented in substantially vertical disposition;
a wafer handling turret rotatable about an axis inclined relative to the vertical and horizontal to move the wafer between a substantially horizontal disposition adjacent the supporting means and a substantially vertical disposition adjacent the target.

20. The sputtering module of claim 19 and further comprising:
at least one wafer holder connected to the turret for holding the wafer horizontally adjacent the supporting means and vertically adjacent the target.

21. The sputtering module of claim 20 and further comprising:
three wafer holders and a precleaning shutter connected to the turret and spaced angularly 90° apart.

22. A module comprising:
a housing including:
a first compartment having an open vertical side, and
a second compartment having an open horizontal side,
said vertical and horizontal sides being adjacent each other,
a turret within said housing rotatable about an axis inclined to the vertical and horizontal between first and second positions, a first wafer holder extending from said turret, said wafer holder being disposed in a horizontal disposition within said first compartment when said turret is in said first position, said wafer holder being disposed in a vertical disposition within said second compartment when said turret is in said second position,
means for rotating said turret between said first and second positions to transport a wafer between said first and second compartments,
wafer processing means in said second compartment to process a wafer located in said second compartment when said turret is in said second position to position said wafer holder in said second compartment, and means cooperating with said first compartment to selectively transfer a wafer to and from said wafer holder in said first compartment when said turret is in said first position.

23. The module of claim 22 further comprising a second wafer holder mounted to said turret, said first and second wafer holders being oriented 180° apart about said inclined axis to locate said first and second wafer holders in said first and second compartments.

24. The module of claim 22 and further comprising:
means for evacuating water vapor from the first compartment.

25. A method for processing semiconductor wafers comprising the steps of:
a) placing a first wafer in a substantially horizontal disposition at a load/unload position within a wafer processing module;
b) rotating the first wafer 180° about an axis inclined to the vertical and horizontal to move the first wafer from a substantially horizontal disposition at the load/unload position to a substantially vertical disposition at a processing position located within the chamber;
c) processing the first wafer at the processing position; and
d) rotating the first wafer 180° about the inclined axis from the processing position back to the load/unload position.

26. The method of claim 25 and further comprising the steps of:
placing a second wafer at the load/unload position when said first wafer is at the processing position; and
moving, after the first wafer has been processed, the second wafer to the processing position simultaneously with step d).

27. The method of claim 25 and further comprising the step of:
heating the wafer at the processing position.

28. The method of claim 25 and further compising the step of:
transferring heat between the wafer and a heat transfer unit while said wafer is at said load/unload position.

* * * * *

UNITED STATES PATENT AND TRADEMARK OFFICE
CERTIFICATE OF CORRECTION

PATENT NO. : 5,154,730

DATED : October 13, 1992

INVENTOR(S) : Julian Hodos and Steven Hurwitt

It is certified that error appears in the above-identified patent and that said Letters Patent is hereby corrected as shown below:

Column 11, Line 31, delete the word "vertical" and substitute the word -- horizontal --

Signed and Sealed this

Sixth Day of September, 1994

Attest:

BRUCE LEHMAN

Attesting Officer

Commissioner of Patents and Trademarks